United States Patent
Woo et al.

(12) 
(10) Patent No.: US 6,228,768 B1
(45) Date of Patent: May 8, 2001

(54) STORAGE-ANNEALING PLATED CU INTERCONNECTS

(75) Inventors: Christy Mei-Chu Woo, Cupertino; Young-Chang Joo, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/184,009

(22) Filed: Nov. 2, 1998

(51) Int. Cl.$^7$ .................................................. H01L 21/302
(52) U.S. Cl. ........................ 438/691; 438/692; 438/694; 438/700; 438/702
(58) Field of Search .................................... 438/687, 692, 438/622, 631, 691, 694, 700, 702; 205/137; 427/98

(56) References Cited

U.S. PATENT DOCUMENTS

| | | | |
|---|---|---|---|
| 5,084,412 | * 1/1992 | Nakasaki | 438/656 |
| 5,674,787 | * 10/1997 | Zhao et al. | 438/627 |
| 5,677,244 | * 10/1997 | Venkatraman | 438/643 |
| 5,693,563 | 12/1997 | Teong | . |
| 5,814,557 | * 9/1998 | Venkatraman et al. | 438/622 |
| 5,824,599 | * 10/1998 | Schacham-Diamand et al. | 438/678 |
| 5,891,513 | * 4/1999 | Dubin et al. | 427/98 |
| 5,895,562 | * 4/1999 | Dubin | 205/137 |
| 6,040,240 | * 3/2000 | Matsubara | 438/618 |

OTHER PUBLICATIONS

"Self–Annealing of Electrochemically Deposited Copper Films in Advanced Interconnect Applications", by Tom Ritzdorf. Lyndon Graham, Shu Jin, Chun Mu, David Foster.

* cited by examiner

Primary Examiner—Robert Kunemund
Assistant Examiner—Binh X Tran

(57) ABSTRACT

Cu metalized wafers are stored at elevated temperatures to substantially complete recrystalization, thereby enabling subsequent CMP with a high degree of wafer to wafer uniformity. Embodiments include electroplating or electroless plating Cu or a Cu alloy to fill one or more damascene openings in a plurality of wafers, placing the wafers in one or more cassettes, and storage-annealing the cassettes on shelves of a cabinet maintained at about 50° C. to about 200° C. in nitrogen for about 2 minutes to about 3 days.

8 Claims, 1 Drawing Sheet

STORAGE-ANNEALING PLATED CU INTERCONNECTS

TECHNICAL FIELD

The present invention relates to semiconductor devices comprising copper (Cu) or Cu alloy interconnection patterns. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, normally of doped monocrystalline silicon, and a plurality of sequentially formed interdielectric layers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines formed in trenchs which typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing an interdielectric layer on a conductive layer comprising at least one conductive pattern, forming an opening in the interdielectric layer by conventional photolithographic and etching techniques, and filling the opening with a conductive material, such as tungsten (W). Excess conductive material on the surface of the interdielectric layer can be removed by chemical-mechanical polishing (CMP). One such method is known as damascene and basically involves forming an opening and filling the opening with a metal. Dual damascene techniques involve forming an opening comprising a lower contact or via opening section in communication with an upper trench opening section, and filling the opening with a conductive material, typically a metal, to simultaneously form a conductive plug in electrical contact with a conductive line. High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and the cross-sectional areas and distances between interconnects decrease, the RC delay caused by the interconnect wiring increases. Thus, the interconnection pattern limits the speed of the integrated circuit. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, the rejection rate due to integrated circuit speed delays severely limits production throughput and significantly increases manufacturing costs. Moreover, as line widths decrease, electrical conductivity and electromigration resistance become increasingly important.

Cu and Cu alloys have received considerable attention as a replacement material for Al in VLSI interconnection metallizations. Cu is relatively inexpensive, easy to process, has a lower resistivity than Al, and has improved electrical properties vis-à-vis W, making Cu a desirable metal for use as a conductive plug as well as conductive wiring. An approach to forming Cu plugs and wiring comprises the use of damascene structures employing CMP, as in Teong, U.S. Pat. No. 5,693,563. However, due to Cu diffusion through the dielectric interlayer, Cu interconnect structures must be encapsulated by a diffusion barrier layer. Typical diffusion barrier metals include tantalum (Ta), tantalum nitride (TaN), titanium (Ti), titanium tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electric current for electroplating. For electroplating, the seed layer should be continuous. For electroless plating, very thin catalytic layers, e.g., less than about 100 Å, can be employed in the form of islets of catalytic metal. Suitable seed layer can comprise Cu itself or an alloy of Cu and any of various alloying elements, such as magnesium (Mg), Al, zinc (Zn), zirconium (Zr), tin (Sn), nickel (Ni), palladium (Pd), silver (Ag) or gold (Au). The seed layer can be sputter deposited or deposited by CVD.

There are, however, significant problems attendant upon conventional Cu interconnect methodology. Deposited Cu and Cu alloys, particularly Cu and Cu alloys deposited by electroless plating or electroplating, undergo self-annealing at room temperature. See Ritzdorf et al., "Self-Annealing of Electrochemically Deposited Copper Films in Advanced Interconnect Applications," International Interconnect Technology Conference (IITC), June 1998, pp. 166–168, sponsored by the IEEE Electron Device Society. Such self-annealing causes recrystalization, a reduction in the resistivity of the deposited Cu or Cu alloy at room temperature by up about 20%, internal stresses and a significant reduction in hardness, e.g., up to about 40%. The Cu self-annealing phenomenon impacts subsequent processing in various ways.

For example, the significant reduction in hardness due to Cu self-annealing causes greater dishing during CMP requiring redesigning CMP parameters. Moreover, conventional practices comprise depositing Cu or Cu alloy, as in one or more damascene openings formed in dielectric layer, on a plurality of wafers and subsequently performing CMP to obtain a planarized surface. Between deposition, such as electroless plating or electroplating, and CMP, the wafers can be processed immediately or, depending upon the production situation at the time, stored in a storage area prior to CMP. As a result, wafers subsequently processed by CMP exhibit different polishing rates depending upon the period of time they were stored at room temperature subsequent to electroplating or electroless plating, during which varying degrees of self-annealing occurred. The difference in polishing rates results in non-uniform CMP, thereby leading to non-uniformities in subsequent metallization levels.

There exists a need for methodology enabling CMP of deposited Cu and Cu alloy layers for copper interconnects with high uniformity from wafer to wafer.

DISCLOSURE OF THE INVENTION

An advantage of the present invention is a method of manufacturing semiconductor devices comprising CMP deposited Cu or Cu alloys to form interconnect members with high wafer to wafer uniformity.

Additional advantages and other features of the present invention are set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing semiconductor devices, the method comprising: depositing a layer of Cu or a Cu alloy on a wafer; and storing the wafer in a storage area at a temperature of about 50° C. to 200° C. in a substantially non-oxidizing gaseous environment.

Embodiments include depositing the Cu or Cu alloy layer by electroplating or electrodeposition on a dielectric layer formed over a plurality of wafers, placing the wafers on cassettes, and storing the cassettes on shelves of a cabinet until the deposited Cu or Cu alloy is no longer capable of undergoing self-annealing at room temperature, i.e., recrystalization is substantially complete and equilibrium resistivity and hardness ar attained. Embodiments further include storing the wafers at a temperature of about 100° C. to 200° C. for about 2 minutes to about 3 days in nitrogen environment, prior to CMP.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
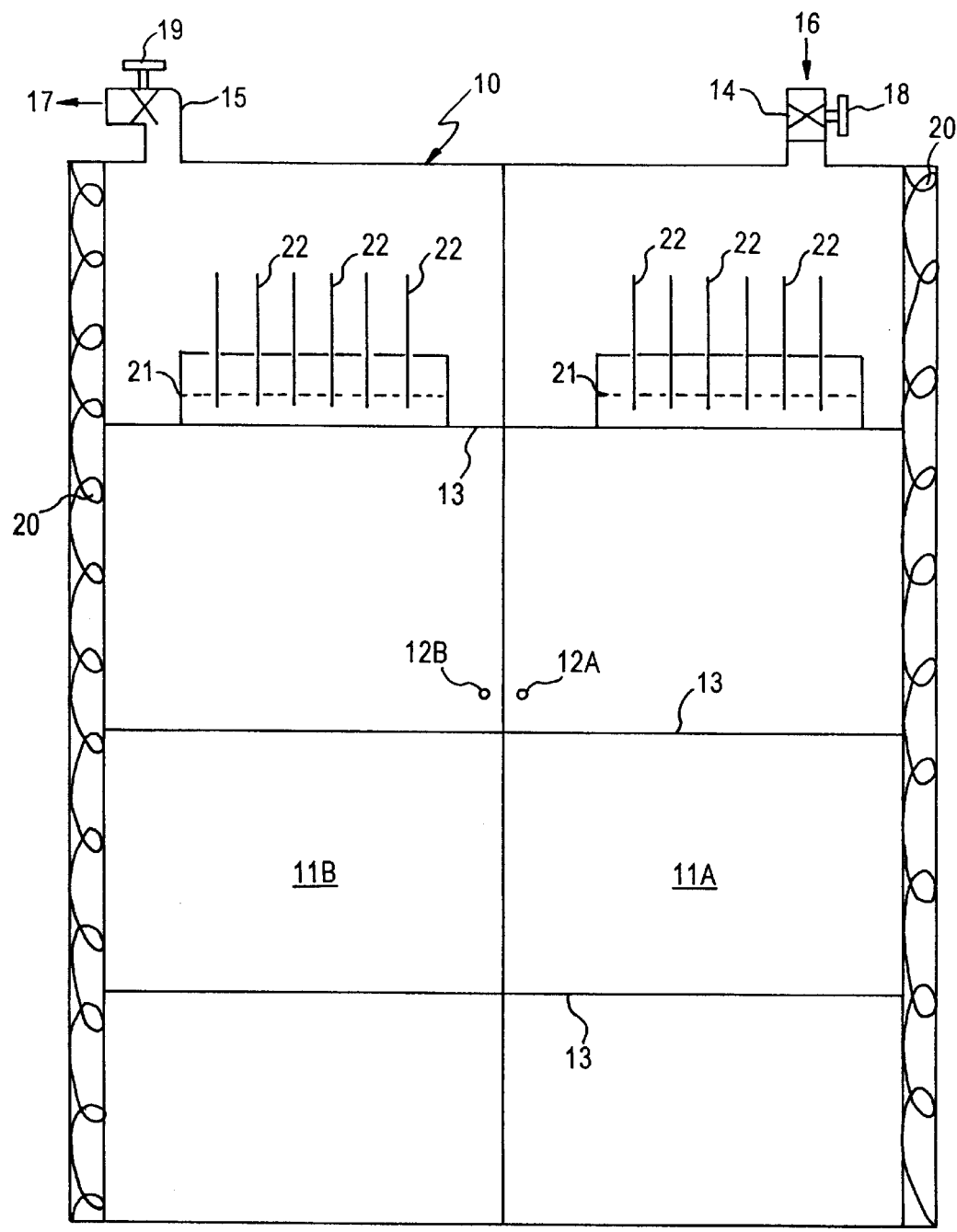
FIG. 1 schematically illustrates a storage-annealing cabinet for use in an embodiment of the present invention.

The present invention addresses and solves non-uniformities in polishing rates encountered upon CMP deposited Cu and Cu alloys, e.g. Cu and Cu alloys deposited by electroplating or electroless plating. Specifically, electroplated and electroless plated Cu or Cu alloy layers are unstable and undergo self-annealing at room temperature. During such self-annealing at room temperature, recrystallization occurs, the resistivity changes, and the mechanical properties, e.g. hardness, of the electroplated or electroless plated Cu or Cu alloy decreases. Accordingly, during subsequent CMP, different polishing rates are encountered depending upon the degree to which the deposited Cu or Cu alloy layer has undergone self-annealing. Such differential polishing rates among deposited Cu and Cu alloys on a plurality of wafers result in non-uniform planarization and, hence, non-uniformities during subsequentmetallization from wafer to wafer. Such wafer to wafer non-uniformity problem is addressed and solved by the present invention in a cost effective, efficient manner without introducing additional processing steps or costly equipment. Accordingly, manufacturing throughput is maintained and high wafer to wafer uniformity is achieved. As employed throughout this application, the symbol Cu is intended to encompass high purity elemental copper as well as Cu-based alloys, such as Cu alloys containing minor amounts of Sn, Zn, manganese (Mn) titanium (Ti) and germanium (Ge).

In accordance with embodiments of the present invention, wafers containing electroplated or electroless plated Cu or Cu alloys, such as filled damascene openings, are simultaneously stored and heat treated at an elevated temperature to achieve equilibrium properties, e.g., an equilibrium resistivity of about 1.7 to about 2 $\mu\Omega$-cm, by accelerating the self-annealing process which was found to be temperature dependant. Embodiments of the present invention comprise storing a plurality of wafers containing electroplated or electroless plated Cu and/or Cu alloys, e.g., filled damascene openings, in a storage area maintained at an elevated temperature, such as about 50° C. to about 200° C., e.g. about 100° C. to about 200° C., in a non-oxidizing gaseous environment, e.g., a nitrogen-containing gas, for about 2 minutes to about 3 hours depending upon the particular temperature. In other embodiments of the present invention, the storage area is maintained under vacuum.

Storage annealing in accordance with embodiments of the present invention advantageously enables processing wafers with Cu metallization exhibiting substantially uniform properties, such as grain size, resistivity and hardness, thereby substantially improving wafer to wafer uniformity. Notably, differential polishing rates are not encountered upon subsequent CMP and, hence, the resulting wafers exhibit high uniformity from wafer to wafer with an attendant increase in device reliability.

The objectives of the present invention are achieved in a cost effective efficient manner without interrupting process flow, as by introducing separate annealing furnaces into the flow. Rather, embodiments of the present invention involve a slight modification of existing storage areas, such as cabinets in which cassettes containing wafers are stored between processing stages, as between Cu metallization and CMP.

Embodiments of the present invention can be implemented employing a storage cabinet as schematically illustrated in FIG. 1. Storage annealing cabinet 10 has outer doors 11A, 11B, with door knobs 12A, 12B, respectively, and contains a plurality of substantially horizontally extending shelves 13, e.g. 3–8. Storage annealing cabinet 10 also comprises inlet 14 for admitting a suitable gas, such as nitrogen, as indicated by arrow 16, and outlet 15, through which the storage cabinet can be evacuated as show by arrow 17. Control Valves 18, 19, are provided on outlet 14 and, 15, respectively. Storage annealing cabinet 10 is provided with a heating coil 20 which can be connected to a suitable control device to maintain storage annealing cabinet 10 at a temperature of about 50° C. to 200° C. Shelves 13 accommodate cassettes 21 in which a plurality of wafers 22 are positioned for storage annealing after Cu or Cu alloy deposition and prior to CMP for a sufficient period of time for substantial equilibration of properties.

Accordingly, the present invention enables effective and efficient use of Cu or Cu alloy metallization in forming reliable Cu or Cu alloy interconnection patterns with high wafer to wafer uniformity employing damascene technology in manufacturing submicron semiconductor devices, e.g., semiconductor devices having a design rule of about 0.18 micron and under. The present invention advantageously enables the manufacture of a plurality of semiconductor devices on a plurality of wafers having Cu or Cu alloy interconnect members with a high degree of reliability and uniformity from wafer to wafer in a cost effective, efficient manner by employing storage annealing between electroplating or electroless plating and CMP.

Cu and/or Cu alloy interconnect members formed in accordance with embodiments of the present invention can be, but are not limited to, interconnects formed by damascene technology. Thus, embodiments of the present invention include forming an interdielectric layer overlying a substrate, forming one or more openings, e.g., damascene openings, in the interdielectric layer, depositing a diffusion barrier layer, such as Ta or TaN lining the opening and on the interdielectric layer, and filing the opening with Cu or a Cu alloy layer. Advantageously, the openings in the interdielectric layer can be filled by with Cu or a Cu alloy by electroless plating or electroplating. In such embodiments, a seed layer, such as Cu or an alloy of Cu with Mg, Al, Zn, Zr, Sn, Ni, Pd, Ag or Au, can be deposited on the barrier layer, as by sputtering or CVD. The wafers are then placed in a storage-annealing chamber to effect substantially complete equilibration of properties, e.g., resistivity and hardness, such that, upon subsequent CMP, the deposited Cu or Cu alloys exhibit a substantially uniform polishing rate from wafer to wafer, thereby enabling formation of Cu or Cu alloy interconnection patterns with high reliability and high wafer to wafer uniformity.

In the various embodiments of the present invention, conventional substrates, interdielectric layers, and barrier layers can be employed. For example, the substrate can be doped monocrystalline silicon or gallium-arsenide. The interdielectric layer employed in the present invention can comprise any dielectric material conventionally employed in the manufacture of semiconductor devices. For example, dielectric materials such as silicon dioxide, phosphosilicate-glass (PSG), boron doped PSG (BPSG), and silicon dioxide derived from tetraethylorthosilicate (TEOS) or silane by PECVD can be employed. The opening formed in dielectric layers are effected by conventional photolithographic and etching techniques. Interdielectric layers in accordance with the present invention can also comprise low dielectric constant materials, including polymers, such as polyimides.

The present invention enables the formation of Cu and/or Cu alloy interconnect members with high reliability and high wafer to wafer uniformity, in a efficient, cost effective manner without sacrifice manufacturing throughput. The present invention enjoys industrial applicability in forming various types of inlaid Cu an Cu alloy interconnection patterns. The present invention is particularly applicable in manufacturing semiconductor devices having submicron features and high aspect ratio openings, e.g. semiconductor devices with a design rule of about 0.18 micron and under.

In the previous descriptions, numerous specific details are set forth, such as specific material structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing semiconductor devices, the method comprising:

depositing a layer of copper (Cu) or a Cu alloy by electrodeposition or electroless deposition on a plurality of wafers; and storing the plurality of wafers in a storage area at a temperature of about 50° C. to 200° C. in a substantially non-oxidizing gaseous environment until the deposited Cu or Cu alloy does not undergo self-annealing and is substantially recrystallized and equilibrium resistivity is achieved.

2. The method according to claim 1, comprising storing the wafer at a temperature of about 100° C. to 200° C. for about 2 minutes to 3 days in nitrogen.

3. The method according to claim 2, comprising depositing the Cu or Cu alloy layer on a dielectric layer.

4. The method according to claim 3, comprising:

depositing the dielectric layer over a semiconductive substrate;

forming damascene openings in the dielectric layer;

depositing a barrier layer lining the damascene openings and on the dielectric layer;

depositing a seed layer on the barrier layer; and electroplating or electroless plating the Cu or Cu alloy layer on the seed layer filling the opening.

5. The method according to claim 1, wherein the storage area is a cabinet containing one or more shelves.

6. The method according to claim 5, comprising:

placing the wafers in one or more cassettes; and storing the one or more cassettes on said one or more shelves.

7. The method according to claim 6 comprising depositing the Cu or Cu alloy layer to form an interconnect.

8. The method according to claim 7, comprising sequentially:

removing a plurality wafers having substantially the same hardness from the storage area; and chemical mechanical polishing the deposited Cu or Cu alloy layer on the wafers.

* * * * *